United States Patent
Ponton et al.

(10) Patent No.: US 9,083,362 B2
(45) Date of Patent: Jul. 14, 2015

(54) OSCILLATOR CIRCUIT

(75) Inventors: Davide Ponton, Warmbad-Villach (AT);
Edwin Thaller, Faak am See (AT);
Nicola Da Dalt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 898 days.

(21) Appl. No.: 13/179,246

(22) Filed: Jul. 8, 2011

(65) Prior Publication Data

US 2013/0009473 A1 Jan. 10, 2013

(51) Int. Cl.
*H03B 1/00* (2006.01)
*H03B 5/12* (2006.01)
*H03L 7/099* (2006.01)

(52) U.S. Cl.
CPC ............... *H03L 7/099* (2013.01); *H03B 5/124* (2013.01); *H03B 5/1215* (2013.01); *H03B 5/1228* (2013.01); *H03B 5/1234* (2013.01); *H03B 2200/0046* (2013.01); *H03B 2200/0066* (2013.01)

(58) Field of Classification Search
CPC .................................... H03B 1/00; H03B 5/12
USPC ............................................... 307/43; 331/15
See application file for complete search history.

(56) References Cited

U.S. PATENT DOCUMENTS

| 7,915,966 | B2 * | 3/2011 | Tokuyama | ................. 331/117 R |
| 8,063,711 | B2 * | 11/2011 | Sutardja | ......................... 331/176 |
| 8,149,067 | B2 * | 4/2012 | Okada | ...................... 331/117 FE |
| 2010/0295627 | A1 | 11/2010 | Okada | |

FOREIGN PATENT DOCUMENTS

CN 101442310 A 5/2009

OTHER PUBLICATIONS

A. Mazzanti and P. Andreani, "A 1.4mW 4.90-to-5.65GHz Class-C CMOS VCO with an Average FoM of 194.5dBc/Hz", IEEE ISSCC 2008, pp. 474-475.
Y. Wachi, T. Nagasaku and H. Kondoh, "A 28GHz Low-Phase-Noise CMOS VCO Using an Amplitude-Redistribution Technique," IEEE ISSCC, 2008, pp. 482-483.
A. Mazzanti and P. Andreani, "Class-C Harmonic CMOS VCOs, With a General Result on Phase Noise", IEEE JSSC, vol .42, n. 12, pp. 2716-2729.
K. Okada, Y. Nomiyama, R. Murakami and A. Matsuzawa, "A 0.114-mW Dual-Conduction Class-C CMOS VCO with 0.2-V Power Supply", IEEE Symp. VLSI Circuits 2009, pp. 228-229.
D. Ponton, P. Palestri, G. Knoblinger, M. Fulde and L. Selmi, "LCOscillator featuring independent Gate biasing implemented in 32 nm CMOS technology", IEEE ICM 2010, pp. 184-187.

* cited by examiner

*Primary Examiner* — Hal Kaplan
(74) *Attorney, Agent, or Firm* — SpryIP, LLC

(57) ABSTRACT

Devices are provided comprising oscillator circuits coupled to a supply voltage via an adjustable resistance. Corresponding methods to control adjustable resistances are also provided.

21 Claims, 5 Drawing Sheets

OSCILLATOR CIRCUIT

FIELD OF THE INVENTION

The present application relates to oscillator circuits and associated methods.

BACKGROUND OF THE INVENTION

Oscillator circuits are used in many applications to generate signals having a desired frequency. For example, oscillator circuits are commonly used to generate clock signals which may for example be used for sampling other signals, like communication signals. Conventional oscillator circuits include for example ring oscillators or oscillators comprising an LC circuit portion comprising an inductivity (L) and a capacitance (C), which may be adjustable, and a so-called negative resistance circuit portion to compensate for energy losses of the LC circuit portion.

In many applications, adjustable oscillator circuits like digitally controlled oscillators (DCOs) where a frequency of an output signal can be adjusted by means of a digital control word or voltage controlled oscillators (VCO) where a frequency of an output signal can be adjusted by applying an appropriate voltage are used. Said oscillator circuits are often used in a so-called phase-locked loop (PLL), which regulates the output frequency of the oscillator signal depending on a reference signal.

The noise performance of such phase-locked loops is at least in part determined and sometimes even dominated by a phase noise of the oscillator circuit used. For many applications, for example communication applications requiring clock frequencies in the GHz range, low phase noise is important. On the other hand, in particular for mobile applications power consumption is an issue.

BRIEF DESCRIPTION OF THE SEVERAL VIEWS OF THE DRAWINGS

Illustrative embodiments of the invention will be described with reference to the attached drawings.

DETAILED DESCRIPTION OF THE DRAWINGS

Figure 1:
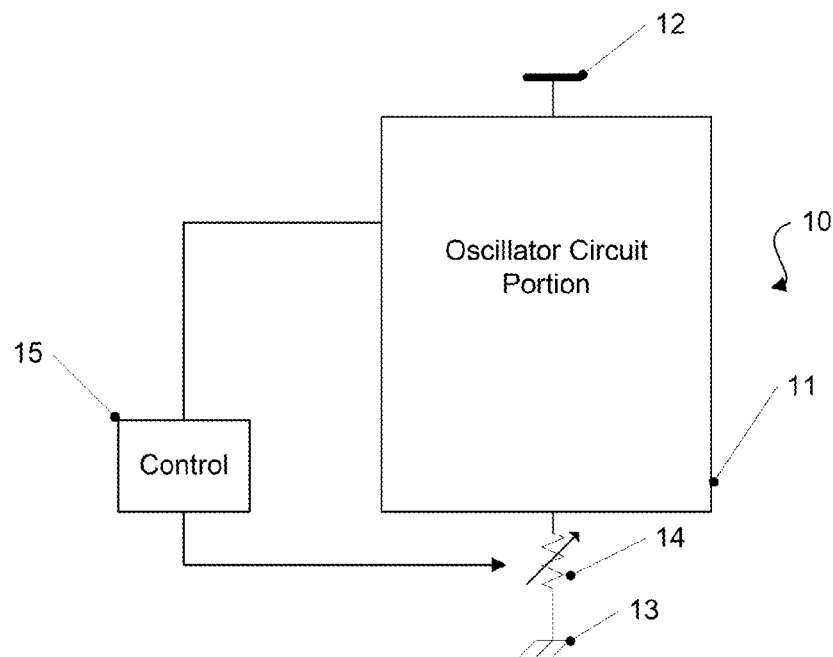
FIG. 1 is a diagram illustrating an oscillator circuit according to an embodiment.

In the following, some embodiments of the present invention will be described in detail with reference to the attached drawings. It is to be understood that the following description is given only for the purpose of illustration and is not to be taken in a limiting sense. The scope of the invention is not intended to be limited by the embodiments described hereinafter with reference to the accompanying drawings.

It is also to be understood that in the following description of embodiments any direct connection or coupling between functional blocks, devices, components, circuit elements, or other physical or functional units shown in the drawings or described herein could also be implemented by an indirect connection or coupling, i.e. a connection or coupling comprising one or more intervening elements. On the other hand, the terms connection or coupling as referring to electrical connections is to be construed as indicating that a current or voltage may be transmitted via the connection or coupling, albeit possibly modified by intervening elements.

Furthermore, it should be appreciated that functional blocks or units shown in the drawings may be implemented as separate circuits in some embodiments, but may also be fully or partially implemented in a common circuit in other embodiments. In other words, the description of various functional blocks is intended to give a clear understanding of various functions performed in a device and is not to be construed as indicating that these functional blocks necessarily have to be implemented as separate physical units. For example, one or more functional blocks may be implemented in a single integrated circuit.

It is further to be understood that any connection which is described as being wire-based in the following specification may also be implemented as a wireless connection and vice versa, unless noted to the contrary.

It should be noted that the drawings are provided to give an illustration of some aspects of embodiments of the present invention and are therefore to be regarded as schematic only. In particular, the elements shown in the drawings are not necessarily to scale with each other, and the placement of various elements of the drawings is chosen to provide a clear understanding of the respective embodiment and is not to be construed as necessarily being a representation of the actual relative location of the various components in implementations of the corresponding embodiments.

The features of the variants embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In the following, embodiments relating to oscillator circuits will be described. An oscillator circuit generally is to be understood as a circuit capable of producing an output signal having a predetermined frequency. In particular, some embodiments relate to adjustable oscillators, where the predetermined frequency is adjustable for example based on a control signal. Some conventional types of controllable oscillators are voltage-controlled oscillators (VCOs), where the control signal is a voltage signal, or digitally controlled oscillators (DCOs), where the control signal is a digital signal.

In some embodiments, for generating the output signal the oscillator circuit may comprise an inductance (L) and a capacitance (C) forming an LC-circuit portion, the resonance frequency of which essentially corresponds to the output frequency of the oscillator circuits. In case of controllable oscillator circuits, the capacitance and/or inductance may be adjustable. To compensate for losses in the LC-circuit portion, additionally a so-called negative resistance circuit portion may be provided for compensating such losses. The negative resistance circuit portion may comprise a pair of cross-coupled transistors, the gates of which may be biased.

Turning now to the Figures, in FIG. 1 a block diagram of a device 10 according to an embodiment is shown. The device 10 of FIG. 1 comprises an oscillator circuit, the oscillator ciruit comprising an oscillator circuit portion 11 and an adjustable resistance 14. The oscillator circuit may be an oscillator circuit as described above, e.g. may, but need not be, a controllable oscillator circuit, and oscillator circuit portion 11 may comprise a LC circuit portion and a negative resistance circuit portion. The oscillator circuit may feature an independent gate biasing of the devices in the negative resistance circuit portion. Oscillator circuit portion 11 is coupled with a first supply voltage 12, for example a positive supply voltage. Furthermore, oscillator circuit portion 11 is coupled with a second supply voltage 13, for example ground, via adjustable resistance 14. Adjustable resistance 14 means that the resistance value of adjustable resistance 14 is adjustable, i.e. variable. In the device 10 of FIG. 1, adjusting of the adjustable resistance 14 is controlled by a control circuit portion 15, which receives an output signal of oscillator circuit portion 11 and controls adjustable resistance 14 based on the output signal. In other embodiments, the adjustment may be performed by an operator of device 10.

Figure 2:
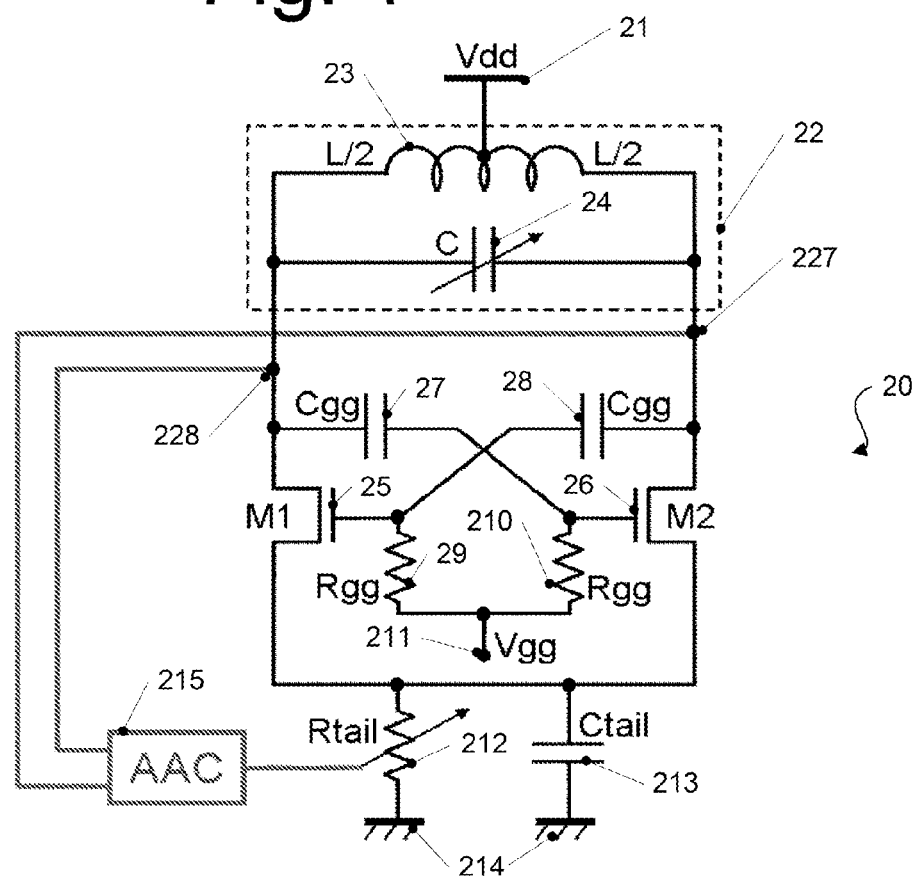
FIG. 2 is a block diagram illustrating an oscillator circuit according to a further embodiment.

In FIG. 2, a device 20 of a further embodiment is shown. Device 20 comprises an oscillator circuit 22-210, 212, 213. The oscillator circuit of device 20 is coupled with a positive supply voltage 21. Furthermore, the oscillator circuit is coupled with ground 214 via a capacitance 213 of the oscillator circuit also labeled Ctail and referred to as tail capacitance and an adjustable resistance 212 of the oscillator circuit also labeled Rtail and also referred to as tail resistance.

Next, the oscillator circuit of device 20 will be described in some more detail.

The oscillator circuit of device 20 comprises an LC-circuit portion 21 which in turn comprises an inductance 23 and an adjustable capacitance 24. Inductance 23 has an inductance value L and is coupled with positive supply voltage 21 in a "middle" thereof, such that the inductance value on each "side" of the coupling is L/2, as indicated in FIG. 2.

Adjustable capacitance 24 is adjustable to change an output frequency of the oscillator circuit of device 20. Adjustable capacitance 24 may for example comprise a plurality of capacitors switchable in response to a control signal and/or may comprise voltage-adjustable capacitances like varactor diodes.

Inductance 23 and adjustable capacitance 24 form a parallel resonance circuit the resonance frequency of which essentially corresponds to the output frequency of the oscillator circuit.

Furthermore, the oscillator circuit of device 20 comprises a so-called negative resistance circuit which in turn comprises MOS transistors 25, 26 which are cross-coupled via capacitances 27, 28 and the gates of which are biased via resistors 29, 210 by a gate bias voltage Vgg 211, as shown in FIG. 2. Capacitances 27, 28 in the embodiment of FIG. 2 have a capacitance value of Cgg, and resistances 29, 210 have resistance values Rgg. The thus formed negative resistance circuit compensates losses of the oscillator, for example losses within the LC circuit formed by inductance 23 and capacitance 24 or losses caused by tapping an output signal at output nodes 227, 228. In some embodiments, through the biasing of the gates of MOS transistors 25, 26 which are also labeled M1 and M2, respectively, by voltage Vgg the performance of the oscillator circuit with respect to the generation of an output voltage swing and with respect to reduction of noise introduced by components of the oscillator circuit may be improved.

In some embodiments, Vgg is smaller than the positive supply voltage 21, Vdd. Vgg in some embodiments may be set in a range of voltages that can provide a desired phase-noise/power consumption target, and then a phase-noise performance may be optimized by adjusting adjustable resistance 212, which may also be referred to as a tail resistance.

Capacitance 24 may in some embodiments be adjusted to obtain a desired output frequency by incorporating device 20 in a phase-locked loop (PLL).

In the embodiment of FIG. 2, the output signal at nodes 227, 228 is fed to an automatic amplitude control (AAC) circuit portion 215, which controls adjustable resistance 212 in response to the output signal. For example, adjustable resistance 212 may be adjusted to obtain a desired peak value of the output signal. In some embodiments, by adjusting the resistance 212 so-called PVT (process voltage temperature) variations may be compensated.

Next, a device 30 according to a further embodiment will be described with reference to FIG. 3.

Figure 3:
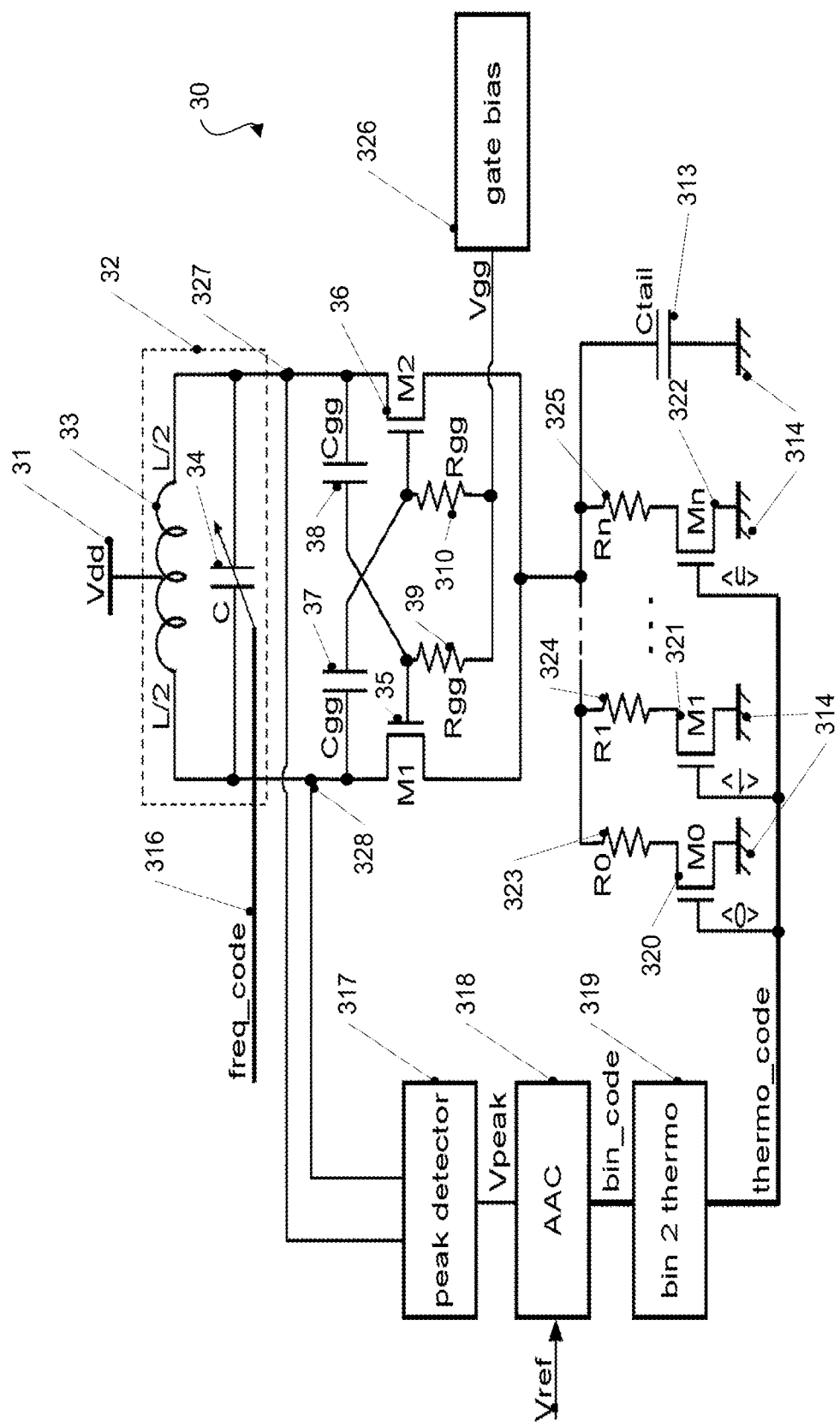
FIG. 3 is a diagram illustrating an oscillator circuit according to another embodiment.

In FIG. 3, elements 31-310 correspond to elements 21-210 of FIG. 2, capacitance 313 of FIG. 3 correspond to capacitance 213 of FIG. 2, and output nodes 327 and 328 correspond to output nodes 227 and 228, respectively, of FIG. 2. Further, in FIG. 3, ground is labeled 314. Therefore, these elements will not be described again. It should be noted that all variations and alternatives described for these elements with respect to FIG. 2 also apply to the embodiment of FIG. 3.

In the embodiment of FIG. 3, adjustable capacitance 34 is controlled by a digital control word freq_code via a control input 316. In other embodiments, adjustable capacitance 34 may be controlled by another type of signal, for example a voltage signal.

Furthermore, the embodiment of FIG. 3 comprises a gate bias generator 326 for generating gate bias voltage Vgg. Gate bias voltage generator 326 in some embodiments may be configured as a variable voltage source to be able to adjust the gate bias voltage Vgg. It should be noted that in many embodiments the performance of the oscillator circuit is not strongly sensitive to Vgg, i.e. Vgg can be chosen within a certain range.

In the embodiment of FIG. 3, an output of the oscillator circuit tapped at nodes 327, 328 is fed to a peak detector 317 which detects a peak voltage Vpeak of a signal output by the oscillator circuit. The voltage Vpeak is fed to an automatic amplitude control circuit portion 318, which compares the voltage Vpeak with a reference voltage Vref and outputs a binary code bin_code in response thereto. Binary code bin_code is fed to a thermometer encoder 319 which converts the binary code to a thermometer-coded value thermo_code for controlling an array of switchable resistances 323-325 which together form an adjustable resistance. In a thermometer code, for example a number of bits set in the code correspond to a number represented by the corresponding binary code.

In the embodiment of FIG. 3, while three resistances 323, 324 and 325 with associated MOS switches 320, 321, 322 are depicted, each resistance being coupled in series with an associated MOS switch, and the series couplings of different resistances being coupled parallel to each other in the embodiment shown, these are intended to represent any desired number of individual resistances, the number being for example chosen based on a desired granularity of the adjustment of the resistance. In the embodiment of FIG. 3, each bit of the thermometer code thermo_code output by converter 319 controls one of MOS switches 320, 321, 322, for example bit number 0 controlling MOS switch 320, bit number 1 controlling MOS switch 321 and bit number n controlling MOS switch 322. In an embodiment, the resistance values R0 to Rn are non-uniform such that at least approximately a linear dependence of the overall resistance depending on the thermometer code thermo_code is achieved. In an embodiment, the dependence of the overall resistance formed by resistors 323-325 on the thermometer code thermo_code may be monotonic. In another embodiment, resistances 323-325 may have nominally equal resistance values R0, R1, Rn, i.e. the resistance values are designed to be equal, but may vary to some extent for example due to process variations or tolerances.

In other embodiments, for example switchable resistances with binary weighted values may be used, and controlled directly by a binary code like bin_code of FIG. 3 without conversion to a thermometer code.

In some embodiments, instead of the coupling shown in FIG. 3, resistances may be coupled in series with switches being provided for bridging individual resistances.

The resistance values R0 to Rn may for example be chosen to enable a switching with steps in the order of 10 ohm.

With the control loop formed by peak detector 317, automatic amplitude control circuit portion 318 and thermometer encoder 319 the resistance value between the oscillator circuit and ground 314 which depends on the number of switched-on resistances 323-325 may be controlled to adjust the peak voltage Vpeak to the reference value Vref, which may for example be a desired peak output voltage.

In the embodiment shown, the phase noise of the oscillator circuit depends on the output voltage swing, and therefore by adjusting the peak voltage Vpeak also the phase noise is adjusted.

Figure 4:
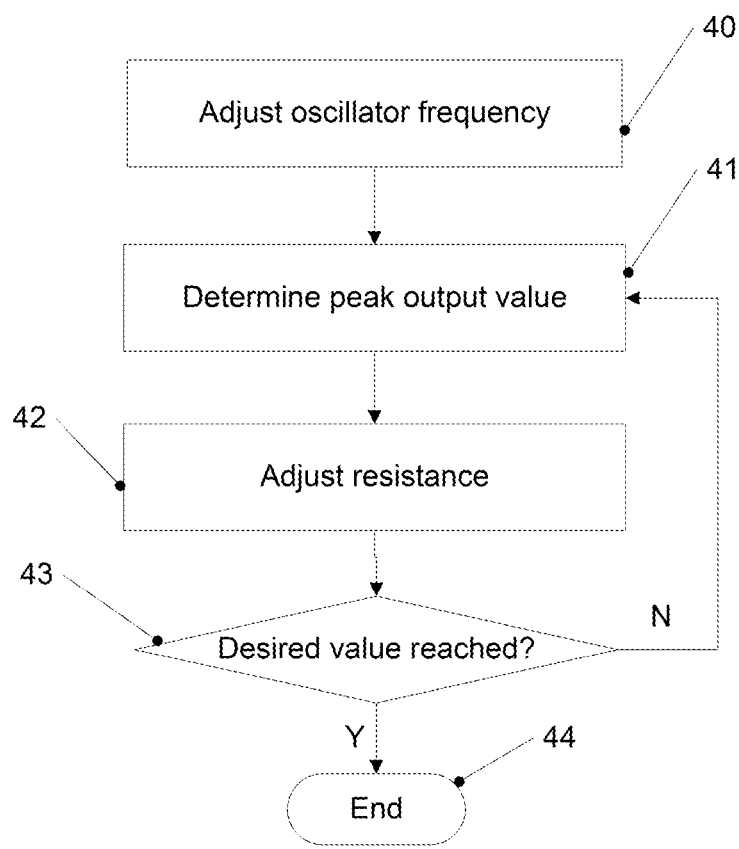
FIG. 4 shows a flowchart illustrating a method according to an embodiment.

In FIG. 4, a flowchart illustrating a method according to an embodiment is shown. The method illustrated in FIG. 4 may be implemented in any of the devices 10, 20 and 30 of FIGS. 1-3, but may also be implemented independently therefrom.

At 40, an oscillator frequency of a signal output by an adjustable oscillator is adjusted. For example, the oscillator may be incorporated in a phase-locked loop (PLL), and the oscillator frequency thus be adjusted depending on a reference signal. For example, in case the device 30 of FIG. 3 is used, the signal freq_code may be adjusted to adjust the oscillator frequency.

At 41, a peak output value of the oscillator is determined, for example by peak detector 317 of FIG. 3.

At 42, an adjustable resistance between an oscillator circuit and a supply voltage is adjusted based on the determined peak value and, in some embodiments, also depending on a reference value.

At 43, it is checked if a desired value for example for the peak output value has been reached. If not, the method jumps back to 41, if yes, the method is ended at 44.

It should be noted that in some embodiments 43 may be omitted, and for example 41 and 42 be continuously repeated to continuously adjust the resistance, for example to compensate for variations during operation. Such variations may for example occur due to varying ambient temperature. It should also be noted that in case the adjustment of the oscillator frequency at 40 is done by means of a phase locked loop, this adjustment may in some embodiments happen essentially continuously in a loop, and with each adjustment of the oscillator frequency by the phase locked loop the resistance may be adjusted, i.e. the operations at 41-43 may be performed. In other embodiments, the adjustment of the adjustable resistance is performed only during a start-up phase of the phase locked loop, e.g. to account for PVT (process voltage temperature) variations, and then switched off during regular operation to avoid frequency steps. In some further embodiments, the adjustment of the adjustable resistance may then be re-activated from time to time, for example during time periods where a high frequency stability is less important. For example, in systems working in burst-mode operation, such a re-activation may be done outside the bursts.

Figure 5:
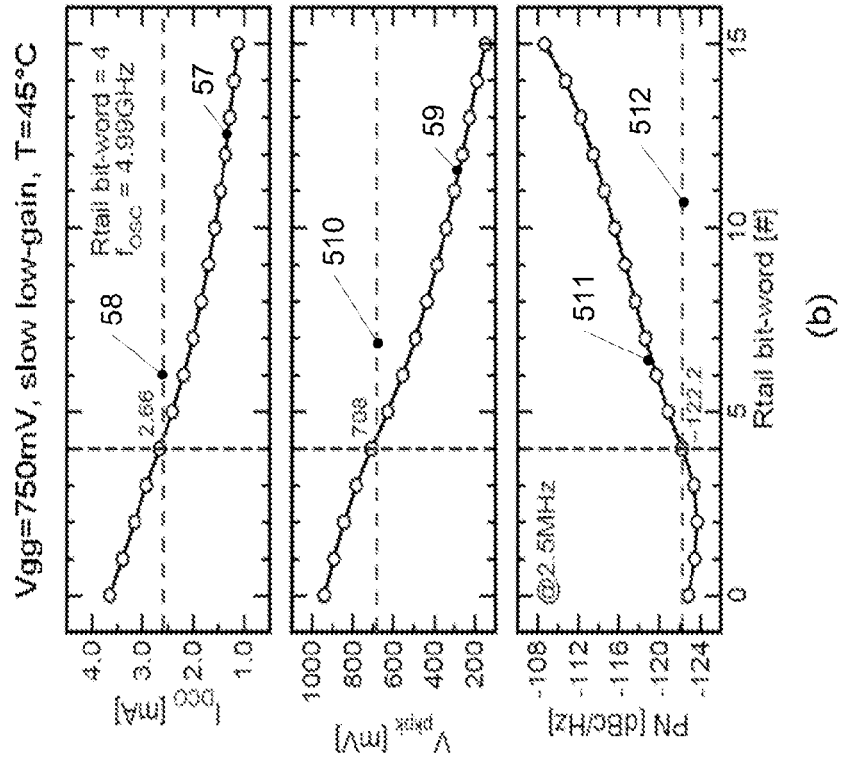
FIGS. 5(a) and (b) show simulation results illustrating the operation of some embodiments.
Figure 5:
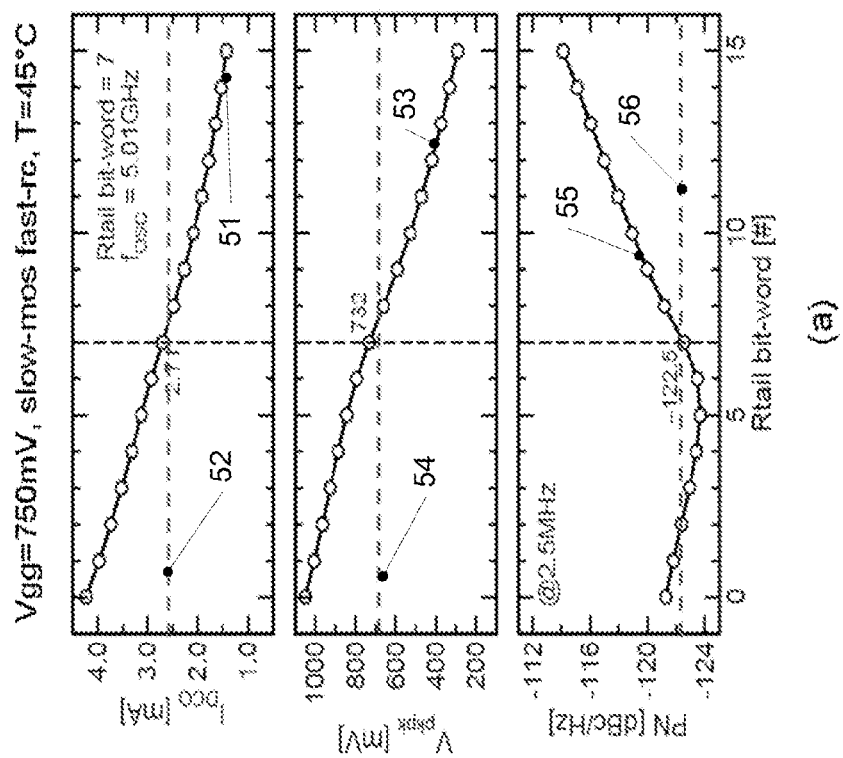

With the embodiments of FIGS. 1-4, a resistance between an oscillator circuit and a supply voltage may be adjusted. In some embodiments, through such an adjustment PVT (process voltage temperature)-variations may be compensated. Simulation results for such a compensation are shown in FIG. 5. As a basis for the simulation in FIG. 5, the embodiment of FIG. 3 was used. The gate biasing voltage Vgg was set to 750 mV for the simulation.

In FIG. 5(a) (left side of FIG. 5) and FIG. 5(b) (right side of FIG. 5) simulations for different process variations are shown, both at a temperature of 45° C. The oscillation frequency was set to approximately 5 gigahertz, 5.01 gigahertz in case of FIG. 5(a) and 4.99 gigahertz in case of FIG. 5(b).

The simulations in FIG. 5(a) are for a so-called slow-mos fast-rc process corner while the simulation in FIG. 5(b) is for a so-called slow low-gain process corner. These designations indicate different behavior of MOS transistors, RC components etc. depending on process variations. Horizontal dashed lines in FIGS. 5(a) and 5(b) show target values, i.e. values which should be reached to obtain e.g. a desired phase noise at a given current. Vertical dashed lines show the value of the control word of the tail resistance, for example the binary code bin_code of FIG. 3, at which the target value is reached for the aforementioned process corners and temperature.

In the topmost diagram of FIGS. 5(a) and 5(b), the current flowing through the oscillator circuit of FIG. 3, i.e. the current flowing between positive supply voltage 31 and ground 314, depending on the control word of the tail resistance. A curve 51 shows the actual behavior, while dashed line 52 shows the target value. In FIG. 5(b), curve 57 shows the actual behavior, while dashed line 58 shows the target value.

In the second graph from the top in FIGS. 5(a) and 5(b), the peak-to-peak voltage in mV of the oscillator output signal depending on the control word controlling the tail resistance is shown. In FIG. 5(a), curve 53 shows the actual behavior, while dashed line 54 shows the target value. In FIG. 5(b), curve 59 shows the actual behavior, and dashed line 510 shows the target value. The peak-to-peak voltage may for example be detected by peak detector 317 of FIG. 3.

Finally, in the bottom-most graph of FIGS. 5(a) and 5(b), the phase noise at 2.5 MHz depending on the bit-word controlling the tail resistance is shown. In FIG. 5(a), curve 55 shows the actual behavior, while dashed line 56 shows the target value, while in FIG. 5(b), curve 511 shows the actual behavior, and dashed line 512 shows the target value.

As can be seen in FIG. 5, for the case of FIG. 5(a) for a value of the control word of 7 the values for current, peak-to-peak voltage and phase noise are at least approximately at their target values, while in case of FIG. 5(b) this is the case for a control word value of 4. For a so-called nominal corner, a control word value of 8 would result in the target values being reached. Therefore, as can be seen from the simulations, in some embodiments by adjusting the tail resistance process variations, e.g. different process corners, may be compensated and parameters of the oscillator brought to their target values irrespective of the process variations.

In the embodiments described with reference to FIGS. 1-5, a resistance between an oscillator circuit portion and a supply voltage, for example ground, is adjusted. In other embodiments, an adjustable current source may be provided between an oscillator circuit portion and a supply voltage. A device 60 according to such an embodiment is shown in FIG. 6.

Figure 6:
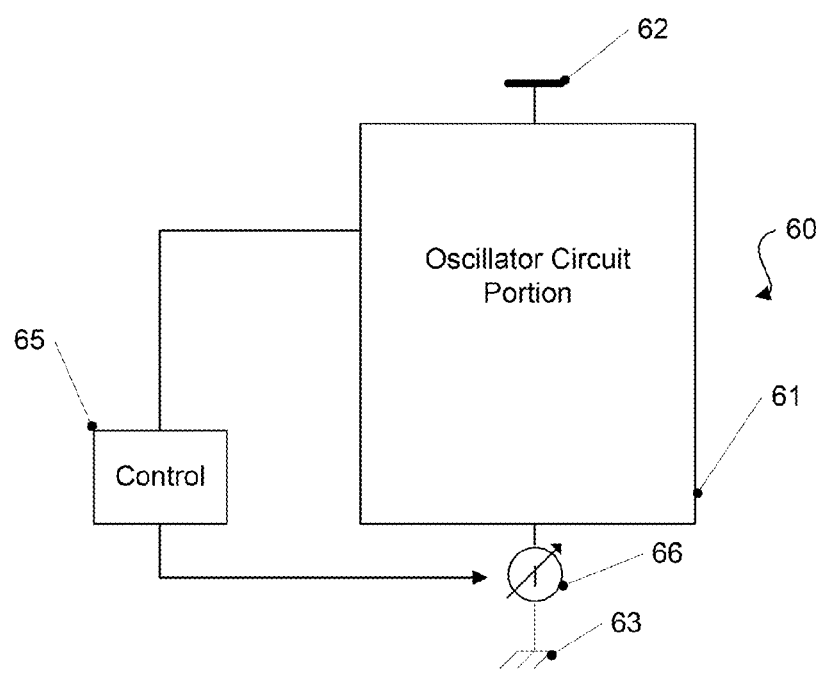
FIG. 6 shows a diagram of an oscillator circuit according to a further embodiment.

In the device 60 of FIG. 6, an oscillator circuit portion 61 is coupled with a first supply voltage 62, for example a positive supply voltage. Oscillator circuit portion may be an oscillator circuit portion comprising an LC circuit portion and a negative resistance circuit portion, for example as explained with reference to FIGS. 2 and 3.

Furthermore, oscillator circuit portion 61 is coupled with a second supply voltage 63, for example ground, via an adjustable current source 66. Adjustable current source generates an adjustable current and, in the embodiment of FIG. 6, is controlled by a control circuit portion 65 based on an output signal of oscillator circuit portion 61. For example, by adjusting adjustable current source 66 a peak output value of oscillator circuit portion 61 may be adjusted to a predetermined value, for example a nominal value.

In the embodiment of FIG. 6, a capacitance (not shown) may be provided in parallel to adjustable current source 66, similar to capacitance 213 of FIG. 2 or 313 of FIG. 3.

As already indicated, the above-described embodiments are merely intended to illustrate some possibilities for implementing the present invention and are not to be construed as limiting.

The invention claimed is:

1. A device, comprising:
an oscillator circuit portion,
a first supply voltage coupled with said oscillator circuit portion,
an adjustable resistance, and
a control circuit portion coupled to an output of said oscillator circuit portion and configured to adjust said adjustable resistance depending on a signal output by the oscillator circuit portion,
a second supply voltage coupled with said oscillator circuit portion via said adjustable resistance.

2. The device of claim 1, wherein said first supply voltage is a positive supply voltage, and said second supply voltage is ground.

3. The device of claim 1,
wherein an oscillation frequency of said oscillator circuit portion is adjustable.

4. The device of claim 1, wherein said oscillator circuit portion comprises an inductance and a capacitance, wherein at least one of said inductance and said capacitance is adjustable.

5. The oscillator device of claim 1, wherein the device comprises a negative resistance circuit, the negative resistance circuit comprising at least one transistor, a gate of the at least one transistor being coupled to a voltage different from said first supply voltage and said second supply voltage.

6. A device, comprising:
a first supply voltage,
an LC circuit portion comprising an inductance and a capacitance, the LC circuit portion being coupled to the first supply voltage,
a negative resistance portion coupled with said LC circuit portion,
an adjustable resistance coupled with said negative resistance circuit portion, and
a second supply voltage coupled with said adjustable resistance.

7. The device of claim 6, wherein said negative resistance portion comprises a first transistor and a second transistor, a first terminal of said first transistor and a first terminal of said second transistor being coupled with said adjustable resistance, a gate terminal of said first transistor and a gate terminal of said second transistor being coupled with a gate bias voltage,
wherein a second terminal of said first transistor is coupled with said gate terminal of said second transistor and with a first output node of said LC circuit portion, and
wherein a second terminal of said second transistor is coupled with said gate terminal of said first transistor and a second output node of said LC circuit portion.

8. The device of claim 7, further comprising an adjustable bias voltage generator configured to generate said gate bias voltage.

9. The device of claim 7, wherein said gate terminal of said first transistor is coupled with said bias voltage via a first resistance and coupled with said second terminal of said second transistor via a first capacitance, and wherein said gate terminal of said second transistor is coupled with said bias voltage via a second resistance and coupled with said second terminal of said first transistor via a second capacitance.

10. The device of claim 6, further comprising a capacitance coupled between said negative resistance circuit portion and said second supply voltage.

11. The device of claim 6, further comprising a control circuit portion coupled to at least one output node of said LC circuit portion and configured to adjust said adjustable resistance.

12. The device of claim 11, wherein said control circuit comprises an automatic amplitude control circuit portion.

13. The device of claim 12, wherein said control circuit comprises a peak detector coupled with said at least one output node and configured to output a peak voltage to said automatic amplitude control portion.

14. The device of claim 11, wherein said control circuit is configured to output a thermometer-coded control signal to said adjustable resistance.

15. The device of claim 6, wherein said adjustable resistance comprises a plurality of switchable resistances.

16. The device of claim 15, where each of said plurality of switchable resistances is coupled in series with an associated switch, the plurality of switchable resistances being coupled in parallel to each other.

17. A method, comprising:
determining a peak output value of an oscillator circuit portion, and
adjusting a resistance of an adjustable resistor coupled between said oscillator circuit portion and a supply voltage depending on the peak output value.

18. The method of claim 17, further comprising repeating said determining and said adjusting at least until a desired value of the peak output value has been reached.

19. The method of claim 17, further comprising adjusting an oscillator frequency of said oscillator circuit.

20. The method of claim 19, wherein said adjusting of the oscillator frequency is performed repeatedly, and said determining a peak output value and said adjusting the resistance is performed for each adjusting of the oscillator frequency.

21. The method of claim 17, wherein said adjusting of the resistance comprises supplying a thermometer-coded signal to a plurality of switches coupled with a plurality of resistances.

* * * * *